US008056257B2

(12) United States Patent
Ohno et al.

(10) Patent No.: US 8,056,257 B2
(45) Date of Patent: Nov. 15, 2011

(54) SUBSTRATE PROCESSING APPARATUS AND SUBSTRATE PROCESSING METHOD

(75) Inventors: Hiroki Ohno, Nirasaki (JP); Kenji Sekiguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1036 days.

(21) Appl. No.: 11/984,100

(22) Filed: Nov. 13, 2007

(65) Prior Publication Data
US 2008/0127508 A1   Jun. 5, 2008

(30) Foreign Application Priority Data

Nov. 21, 2006   (JP) .................................. 2006-314386

(51) Int. Cl.
*F26B 3/00* (2006.01)

(52) U.S. Cl. ................... 34/413; 34/218; 34/381; 34/78

(58) Field of Classification Search ................ 34/70, 80, 34/90, 77, 78, 210, 218, 381, 414, 97, 640; 134/95.2, 63
See application file for complete search history.

(56) References Cited

U.S. PATENT DOCUMENTS

| 4,560,576 | A | * | 12/1985 | Lewis et al. ................ 427/532 |
| 4,664,747 | A | * | 5/1987 | Sekiguchi et al. ........... 438/709 |
| 5,974,689 | A | * | 11/1999 | Ferrell et al. .................. 34/340 |
| 6,008,142 | A | * | 12/1999 | Hirokane ....................... 438/770 |
| 6,119,366 | A | * | 9/2000 | Ferrell et al. .................. 34/340 |
| 6,128,830 | A | * | 10/2000 | Bettcher et al. ............... 34/404 |
| 6,190,835 | B1 | * | 2/2001 | Haas et al. .................... 430/311 |
| 6,255,360 | B1 | * | 7/2001 | Domschke et al. ............ 521/64 |
| 6,322,633 | B1 | * | 11/2001 | Bexten et al. ...................... 134/1 |
| 6,328,809 | B1 | * | 12/2001 | Elsawy et al. ..................... 134/3 |
| 6,394,107 | B1 | * | 5/2002 | Kesari et al. ................. 134/22.1 |
| 6,403,149 | B1 | * | 6/2002 | Parent et al. .................. 427/130 |
| 6,412,502 | B1 | * | 7/2002 | Bexten et al. ................. 134/148 |
| 6,424,091 | B1 | * | 7/2002 | Sawada et al. ........... 315/111.81 |
| 6,552,350 | B2 | * | 4/2003 | Haas et al. .................... 250/365 |
| 6,558,432 | B2 | * | 5/2003 | Schulte et al. ................... 8/142 |
| 6,602,844 | B2 | * | 8/2003 | Kanno et al. .................. 510/412 |
| 6,620,260 | B2 | * | 9/2003 | Kumagai et al. ................ 134/26 |
| 6,642,121 | B2 | * | 11/2003 | Camalleri et al. ............ 438/368 |
| 6,706,867 | B1 | * | 3/2004 | Lorenz ........................ 536/23.1 |
| 6,729,040 | B2 | * | 5/2004 | Mehmandoust ................ 34/443 |
| 6,755,871 | B2 | * | 6/2004 | Damaso et al. .................. 8/137 |

(Continued)

FOREIGN PATENT DOCUMENTS

EP   526644 A1 * 2/1993

(Continued)

OTHER PUBLICATIONS

Taiwan Office Action issued on May 30, 2011 for Application No. 096143950 with English translation.

(Continued)

*Primary Examiner* — Stephen M. Gravini

(74) *Attorney, Agent, or Firm* — Smith, Gambrell & Russell, LLP

(57) ABSTRACT

A substrate processing apparatus includes a chamber, and a cleaning-liquid supply unit that supplies a cleaning liquid containing hydrofluoro ether onto a substrate to be processed placed in the chamber. In the chamber, there is further disposed a gas supply unit that supplies into the chamber a gas for preventing moisture from being adhered to a substrate to be processed, when a cleaning liquid containing hydrofluoro ether is supplied onto the substrate to be processed.

17 Claims, 5 Drawing Sheets

U.S. PATENT DOCUMENTS

| | | | |
|---|---|---|---|
| 6,797,076 B1* | 9/2004 | Bryer | 134/33 |
| 6,816,232 B2* | 11/2004 | Takahashi et al. | 355/53 |
| 6,837,768 B2* | 1/2005 | Kawasaki | 445/60 |
| 6,908,624 B2* | 6/2005 | Hossainy et al. | 424/424 |
| 6,953,082 B2* | 10/2005 | Costello et al. | 165/80.4 |
| 6,989,088 B2* | 1/2006 | Kanno et al. | 205/430 |
| 7,041,226 B2* | 5/2006 | Vaideeswaran et al. | 216/27 |
| 7,041,608 B2* | 5/2006 | Sieber et al. | 438/780 |
| 7,055,579 B2* | 6/2006 | Costello et al. | 165/80.5 |
| 7,081,277 B1* | 7/2006 | Watanabe et al. | 427/493 |
| 7,084,041 B2* | 8/2006 | Rhee et al. | 438/343 |
| 7,116,396 B2* | 10/2006 | Tsuji et al. | 355/30 |
| 7,128,133 B2* | 10/2006 | Costello et al. | 165/80.4 |
| 7,147,670 B2* | 12/2006 | Schulte et al. | 8/142 |
| 7,172,897 B2* | 2/2007 | Blackburn et al. | 435/287.2 |
| 7,195,676 B2* | 3/2007 | McDermott et al. | 134/2 |
| 7,267,426 B2* | 9/2007 | Miyajima et al. | 347/45 |
| 7,294,731 B1* | 11/2007 | Flynn et al. | 556/427 |
| 7,300,468 B2* | 11/2007 | Wright et al. | 8/142 |
| 7,335,701 B2* | 2/2008 | Watanabe et al. | 525/102 |
| 7,378,382 B2* | 5/2008 | Serobian et al. | 510/466 |
| 7,390,427 B2* | 6/2008 | Costello et al. | 252/68 |
| 7,415,985 B2* | 8/2008 | Nagami | 134/104.2 |
| 7,418,970 B2* | 9/2008 | Sugimoto et al. | 134/105 |
| 7,435,265 B2* | 10/2008 | Damaso et al. | 8/142 |
| 7,438,392 B2* | 10/2008 | Vaideeswaran et al. | 347/65 |
| 7,454,927 B2* | 11/2008 | Luckman et al. | 68/13 R |
| 7,476,331 B2* | 1/2009 | Merchant et al. | 252/68 |
| 7,497,877 B2* | 3/2009 | Goedhart et al. | 8/137 |
| 7,513,004 B2* | 4/2009 | Luckman et al. | 8/158 |
| 7,534,308 B2* | 5/2009 | Schulte et al. | 134/26 |
| 7,553,514 B2* | 6/2009 | Fan et al. | 427/162 |
| 7,601,385 B2* | 10/2009 | Morikawa et al. | 427/69 |
| 7,625,699 B2* | 12/2009 | Devlin et al. | 435/6 |
| 7,641,405 B2 | 1/2010 | Fukutomi | 396/611 |
| 7,651,532 B2* | 1/2010 | Wright et al. | 8/142 |
| 7,651,627 B2* | 1/2010 | Costello et al. | 252/68 |
| RE41,115 E* | 2/2010 | Schulte et al. | 8/142 |
| 7,655,212 B2* | 2/2010 | Sandford et al. | 423/544 |
| 7,682,647 B2* | 3/2010 | Hossainy et al. | 427/2.1 |
| 7,697,111 B2* | 4/2010 | Shirai et al. | 355/53 |
| 7,718,421 B2* | 5/2010 | Chen et al. | 435/288.5 |
| 7,727,725 B2* | 6/2010 | Huang et al. | 435/6 |
| 7,739,891 B2* | 6/2010 | Luckman et al. | 68/124 |
| 7,744,991 B2* | 6/2010 | Fischer et al. | 428/317.9 |
| 7,745,653 B2* | 6/2010 | Iyer et al. | 556/400 |
| 7,749,909 B2* | 7/2010 | Tomita et al. | 438/694 |
| 7,807,211 B2* | 10/2010 | Hossainy et al. | 427/2.1 |
| 7,807,219 B2* | 10/2010 | DeYoung | 427/140 |
| 7,820,190 B2* | 10/2010 | Hossainy et al. | 424/423 |
| 7,838,425 B2* | 11/2010 | Tomita et al. | 438/690 |
| 7,867,288 B2* | 1/2011 | Schulte et al. | 8/142 |
| 7,906,175 B2* | 3/2011 | Xia et al. | 427/248.1 |
| 2001/0037822 A1* | 11/2001 | Elsawy et al. | 134/30 |
| 2001/0047595 A1* | 12/2001 | Mehmandoust | 34/443 |
| 2002/0010965 A1* | 1/2002 | Schulte et al. | 8/142 |
| 2002/0011258 A1* | 1/2002 | Damaso et al. | 134/26 |
| 2002/0037371 A1* | 3/2002 | Kumagai et al. | 427/430.1 |
| 2002/0051358 A1* | 5/2002 | Haas et al. | 362/96 |
| 2002/0125458 A1* | 9/2002 | Kanno et al. | 252/70 |
| 2002/0137423 A1* | 9/2002 | Kawasaki | 445/3 |
| 2002/0155673 A1* | 10/2002 | Camalleri et al. | 438/343 |
| 2002/0174882 A1* | 11/2002 | Kimura | 134/2 |
| 2003/0007543 A1* | 1/2003 | Grenfell et al. | 374/57 |
| 2003/0138739 A1* | 7/2003 | Sasaoka et al. | 430/350 |
| 2003/0199409 A1* | 10/2003 | Kanno et al. | 510/177 |
| 2003/0219630 A1* | 11/2003 | Moriwaki et al. | 428/694 R |
| 2003/0220219 A1* | 11/2003 | Schulte et al. | 510/407 |
| 2004/0053290 A1* | 3/2004 | Terbrueggen et al. | 435/6 |
| 2004/0083966 A1* | 5/2004 | Takahashi et al. | 118/715 |
| 2004/0086542 A1* | 5/2004 | Hossainy et al. | 424/423 |
| 2004/0118697 A1* | 6/2004 | Wen et al. | 205/104 |
| 2004/0161788 A1* | 8/2004 | Chen et al. | 435/6 |
| 2004/0163683 A1* | 8/2004 | Sugimoto et al. | 134/56 R |
| 2004/0173246 A1* | 9/2004 | Damaso et al. | 134/26 |
| 2004/0192001 A1* | 9/2004 | Rhee et al. | 438/309 |
| 2004/0220665 A1* | 11/2004 | Hossainy et al. | 623/1.42 |
| 2004/0241417 A1* | 12/2004 | Fischer et al. | 428/317.9 |
| 2005/0001879 A1* | 1/2005 | Miyajima et al. | 347/45 |
| 2005/0022418 A1* | 2/2005 | Rietmann | 34/493 |
| 2005/0056307 A1* | 3/2005 | Nagami | 134/95.2 |
| 2005/0089539 A1* | 4/2005 | Scholz et al. | 424/401 |
| 2005/0091757 A1* | 5/2005 | Luckman et al. | 8/137.5 |
| 2005/0092033 A1* | 5/2005 | Luckman et al. | 68/124 |
| 2005/0093912 A1* | 5/2005 | Vaideeswaran et al. | 347/20 |
| 2005/0112292 A1* | 5/2005 | Parker et al. | 427/508 |
| 2005/0116138 A1* | 6/2005 | Hanada et al. | 250/206 |
| 2005/0126606 A1* | 6/2005 | Goedhart et al. | 134/42 |
| 2005/0126756 A1* | 6/2005 | Costello et al. | 165/80.4 |
| 2005/0127322 A1* | 6/2005 | Costello et al. | 252/71 |
| 2005/0140959 A1* | 6/2005 | Tsuji et al. | 355/72 |
| 2005/0176230 A1* | 8/2005 | Sieber et al. | 438/609 |
| 2005/0222002 A1* | 10/2005 | Luckman et al. | 510/188 |
| 2005/0224747 A1* | 10/2005 | Costello et al. | 252/70 |
| 2005/0233062 A1* | 10/2005 | Hossainy et al. | 427/2.1 |
| 2005/0250668 A1* | 11/2005 | Serobian et al. | 510/466 |
| 2005/0257812 A1* | 11/2005 | Wright et al. | 134/42 |
| 2005/0263173 A1* | 12/2005 | Luckman et al. | 134/42 |
| 2005/0272054 A1* | 12/2005 | Cargill et al. | 435/6 |
| 2006/0011217 A1* | 1/2006 | McDermott et al. | 134/26 |
| 2006/0051384 A1* | 3/2006 | Scholz et al. | 424/405 |
| 2006/0051385 A1* | 3/2006 | Scholz | 424/405 |
| 2006/0052452 A1* | 3/2006 | Scholz | 514/557 |
| 2006/0077221 A1* | 4/2006 | Vaideeswaran et al. | 347/20 |
| 2006/0160205 A1* | 7/2006 | Blackburn et al. | 435/287.2 |
| 2006/0180785 A1* | 8/2006 | Merchant et al. | 252/67 |
| 2006/0203218 A1* | 9/2006 | Shirai et al. | 355/53 |
| 2006/0223855 A1* | 10/2006 | Kong et al. | 514/315 |
| 2006/0241247 A1* | 10/2006 | Watanabe et al. | 525/326.2 |
| 2006/0249182 A1 | 11/2006 | Hayamizu et al. | |
| 2006/0260064 A1* | 11/2006 | Luckman et al. | 8/158 |
| 2006/0260065 A1* | 11/2006 | Wright et al. | 8/158 |
| 2006/0291060 A1* | 12/2006 | Shirai et al. | 359/582 |
| 2006/0291854 A1* | 12/2006 | Kaneyama et al. | 396/604 |
| 2007/0018134 A1* | 1/2007 | Costello et al. | 252/67 |
| 2007/0031847 A1* | 2/2007 | Cargill et al. | 435/6 |
| 2007/0039866 A1* | 2/2007 | Schroeder et al. | 210/265 |
| 2007/0060955 A1* | 3/2007 | Strother et al. | 607/2 |
| 2007/0060967 A1* | 3/2007 | Strother et al. | 607/31 |
| 2007/0060968 A1* | 3/2007 | Strother et al. | 607/34 |
| 2007/0060979 A1* | 3/2007 | Strother et al. | 607/60 |
| 2007/0060980 A1* | 3/2007 | Strother et al. | 607/61 |
| 2007/0066995 A1* | 3/2007 | Strother et al. | 607/2 |
| 2007/0067000 A1* | 3/2007 | Strother et al. | 607/36 |
| 2007/0071439 A1* | 3/2007 | Kaneyama et al. | 396/611 |
| 2007/0075553 A1* | 4/2007 | Bentwich | 435/5 |
| 2007/0087955 A1* | 4/2007 | Schulte et al. | 510/407 |
| 2007/0098600 A1* | 5/2007 | Kayyem | 422/102 |
| 2007/0137675 A1* | 6/2007 | McDermott et al. | 134/26 |
| 2007/0141593 A1* | 6/2007 | Lee et al. | 435/6 |
| 2007/0159615 A1* | 7/2007 | Horiuchi | 355/72 |
| 2007/0190437 A1* | 8/2007 | Kaneyama et al. | 430/30 |
| 2007/0240743 A1* | 10/2007 | Hiroe et al. | 134/94.1 |
| 2007/0245591 A1* | 10/2007 | Gens et al. | 34/443 |
| 2007/0275867 A1* | 11/2007 | Serobian | 510/466 |
| 2007/0298163 A1* | 12/2007 | DeYoung | 427/140 |
| 2008/0003564 A1* | 1/2008 | Chen et al. | 435/5 |
| 2008/0050600 A1* | 2/2008 | Fan et al. | 428/447 |
| 2008/0050926 A1* | 2/2008 | Nakagawa | 438/710 |
| 2008/0072931 A1* | 3/2008 | Kimura | 134/26 |
| 2008/0073563 A1* | 3/2008 | Novak et al. | 250/441.11 |
| 2008/0081220 A1* | 4/2008 | Watanabe et al. | 428/814 |
| 2008/0083432 A1* | 4/2008 | Wright et al. | 134/10 |
| 2008/0093340 A1* | 4/2008 | Nakamori et al. | 216/57 |
| 2008/0117401 A1* | 5/2008 | Tani | 355/67 |
| 2008/0127508 A1* | 6/2008 | Ohno et al. | 34/552 |
| 2008/0174748 A1* | 7/2008 | Nagasaka | 355/30 |
| 2008/0196658 A1* | 8/2008 | Fukutomi et al. | 118/58 |
| 2008/0198341 A1* | 8/2008 | Fukutomi et al. | 355/27 |
| 2008/0198342 A1* | 8/2008 | Fukutomi | 355/27 |
| 2008/0212042 A1* | 9/2008 | Morimoto et al. | 355/30 |
| 2008/0212049 A1* | 9/2008 | Fukutomi et al. | 355/30 |
| 2008/0220264 A1* | 9/2008 | Iyer et al. | 428/447 |
| 2008/0230101 A1* | 9/2008 | Hayashi | 134/57 R |
| 2008/0233512 A1* | 9/2008 | Nishii et al. | 430/117.32 |
| 2008/0242794 A1* | 10/2008 | Sandford et al. | 524/515 |
| 2008/0245509 A1* | 10/2008 | Costello et al. | 165/104.19 |

| | | | |
|---|---|---|---|
| 2008/0263781 A1* | 10/2008 | Damaso et al. | 8/142 |
| 2008/0287538 A1* | 11/2008 | Scholz et al. | 514/552 |
| 2008/0299554 A1* | 12/2008 | Huang et al. | 435/6 |
| 2008/0315459 A1* | 12/2008 | Zhang et al. | 264/338 |
| 2009/0005339 A1* | 1/2009 | Scholz et al. | 514/53 |
| 2009/0079025 A1* | 3/2009 | Yamazaki | 257/506 |
| 2009/0084405 A1* | 4/2009 | Kimura et al. | 134/18 |
| 2009/0103070 A1* | 4/2009 | Shirai et al. | 355/67 |
| 2009/0130682 A1* | 5/2009 | Li et al. | 435/6 |
| 2009/0137118 A1* | 5/2009 | Hirota et al. | 438/674 |
| 2009/0148688 A1* | 6/2009 | Sasaki et al. | 428/315.9 |
| 2009/0193594 A1* | 8/2009 | Schulte et al. | 8/142 |
| 2009/0208883 A1* | 8/2009 | Nagasaka | 430/325 |
| 2009/0226541 A1* | 9/2009 | Scholz et al. | 424/672 |
| 2009/0250431 A1* | 10/2009 | Inukai et al. | 216/51 |
| 2009/0258218 A1* | 10/2009 | Sandford et al. | 428/327 |
| 2009/0258984 A1* | 10/2009 | Sandford et al. | 524/403 |
| 2009/0262339 A1* | 10/2009 | Suga et al. | 356/237.3 |
| 2009/0291147 A1* | 11/2009 | Sandford et al. | 424/618 |
| 2009/0311874 A1* | 12/2009 | Tomita et al. | 438/759 |
| 2010/0026760 A1* | 2/2010 | Matsuo | 347/47 |
| 2010/0075054 A1* | 3/2010 | Kaneyama et al. | 427/331 |
| 2010/0075504 A1* | 3/2010 | Tomita et al. | 438/706 |
| 2010/0081097 A1* | 4/2010 | Kaneyama et al. | 430/422 |
| 2010/0101497 A1* | 4/2010 | Izuta et al. | 118/730 |
| 2010/0136213 A1* | 6/2010 | Hossainy et al. | 427/2.25 |
| 2010/0171022 A1* | 7/2010 | Fujimaki et al. | 248/559 |
| 2010/0173024 A1* | 7/2010 | McDaniel | 424/729 |
| 2010/0206337 A1* | 8/2010 | Hiroshiro et al. | 134/26 |
| 2010/0209916 A1* | 8/2010 | Zon | 435/6 |
| 2010/0216154 A1* | 8/2010 | Huang et al. | 435/6 |
| 2010/0218621 A1* | 9/2010 | Chen et al. | 73/863.11 |
| 2010/0218932 A1* | 9/2010 | Fischer et al. | 165/185 |
| 2010/0220305 A1* | 9/2010 | Shirai et al. | 355/67 |
| 2010/0236579 A1* | 9/2010 | Araki et al. | 134/26 |
| 2010/0239986 A1* | 9/2010 | Kaneyama et al. | 430/434 |
| 2010/0240219 A1* | 9/2010 | Tomita et al. | 438/706 |
| 2010/0242958 A1* | 9/2010 | Jinks et al. | 128/203.12 |
| 2010/0247932 A1* | 9/2010 | Jinks et al. | 428/447 |
| 2010/0263667 A1* | 10/2010 | Jinks et al. | 128/203.15 |
| 2010/0283979 A1* | 11/2010 | Nakano et al. | 355/30 |
| 2010/0283980 A1* | 11/2010 | Sato et al. | 355/30 |
| 2010/0304310 A1* | 12/2010 | Sato | 430/325 |
| 2010/0316868 A1* | 12/2010 | David et al. | 428/336 |
| 2010/0325913 A1* | 12/2010 | Wang et al. | 34/423 |
| 2010/0328637 A1* | 12/2010 | Nishii | 355/67 |
| 2011/0000512 A1* | 1/2011 | Toshima et al. | 134/34 |
| 2011/0001271 A1* | 1/2011 | Hossainy et al. | 264/345 |
| 2011/0003068 A1* | 1/2011 | Hossainy et al. | 427/2.25 |
| 2011/0008529 A1* | 1/2011 | Hossainy et al. | 427/2.25 |
| 2011/0073138 A1* | 3/2011 | Schulte et al. | 134/26 |
| 2011/0079043 A1* | 4/2011 | Flynn et al. | 62/502 |

FOREIGN PATENT DOCUMENTS

| | | | |
|---|---|---|---|
| EP | 548596 A2 * | 6/1993 | |
| EP | 702397 A2 * | 3/1996 | |
| EP | 709877 A1 * | 5/1996 | |
| EP | 909837 A2 * | 4/1999 | |
| EP | 938134 A2 * | 8/1999 | |
| EP | 1076358 A2 * | 2/2001 | |
| EP | 1191575 A2 * | 3/2002 | |
| EP | 1324374 A2 * | 7/2003 | |
| GB | 2284706 A * | 6/1995 | |
| JP | 54081594 A * | 6/1979 | |
| JP | 58108744 A * | 6/1983 | |
| JP | 59055043 A * | 3/1984 | |
| JP | 59100265 A * | 6/1984 | |
| JP | 59193030 A * | 11/1984 | |
| JP | 60210837 A * | 10/1985 | |
| JP | 61027621 A * | 2/1986 | |
| JP | 61101489 A * | 5/1986 | |
| JP | 61101490 A * | 5/1986 | |
| JP | 2002-124504 | 4/2002 | |
| JP | 2005-05469 | 1/2005 | |
| JP | 2005-123218 | 5/2005 | |
| JP | 2006-41065 | 2/2006 | |
| WO | WO 9215115 A1 * | 9/1992 | |
| WO | WO 9428578 A1 * | 12/1994 | |
| WO | WO 9714178 A1 * | 4/1997 | |
| WO | WO 9925494 A1 * | 5/1999 | |
| WO | WO 9959759 A2 * | 11/1999 | |
| WO | WO 9964814 A1 * | 12/1999 | |
| WO | WO 2004095560 A1 * | 11/2004 | |
| WO | WO 2009072402 A1 * | 6/2009 | |
| WO | WO 2010050363 A1 * | 5/2010 | |

OTHER PUBLICATIONS

Korean Office Action, issued Feb. 9, 2011, with English translation.

* cited by examiner

SUBSTRATE PROCESSING APPARATUS AND SUBSTRATE PROCESSING METHOD

FIELD OF THE INVENTION

The present invention relates to a substrate processing apparatus and a substrate processing method for processing a surface of a substrate to be processed such as a semiconductor wafer.

BACKGROUND ART

In manufacturing steps of a semiconductor device, there is a possibility that particles adhere to a surface of a semiconductor wafer (hereinafter also referred to simply as "wafer"), during a film-deposition process and an etching process for the wafer, for example. Thus, it is necessary to clean the surface of the wafer.

As a wafer cleaning apparatus for cleaning a wafer, there has been known an apparatus that cleans a wafer, by supplying a cleaning liquid of a deionized water or a chemical liquid onto a surface of the wafer which is being rotated by a spin chuck, then rinsing the wafer, and finally rotating the wafer at a high speed to dry the same.

There is a case in which a cleaning liquid containing hydrofluoro ether (hereinafter also referred to simply as "HFE") is used as a cleaning liquid to be supplied to the wafer (see, JP2005-5469A, JP2006-41065A, and JP2002-124504A). As compared with a conventional cleaning liquid of, e.g., a deionized water, a surface tension and a viscosity of the cleaning liquid containing HFE are significantly lowered. Thus, the cleaning liquid containing HFE is capable of easily entering small recesses in a surface of a wafer, so that a slight amount of particles resting in the small recesses can be favorably removed. Further, a specific gravity of HFE is about 1.5, which is greater than a specific gravity of water. Thus, when HFE is supplied onto a surface of a wafer, the HFE collides with the wafer with a greater kinetic energy. As a result, a processing efficiency of the wafer can be enhanced. Furthermore, since HFE does not have a flash point, there is no possibility that HFE catches fire during a process of the wafer.

DISCLOSURE OF THE INVENTION

However, since HFE is a highly volatile liquid, when a cleaning liquid containing HFE is supplied to a wafer, a heat of the wafer is taken away by evaporation of the HFE, and thus a temperature of the wafer is rapidly lowered. When the temperature of the wafer is rapidly lowered, the water vapor in an atmosphere surrounding the wafer is cooled to become water droplets, and these water droplets may adhere to a surface of the wafer. The water droplets adhering to the surface of the wafer during a cleaning process of the wafer invites problems such as formation of a watermark on the surface of the wafer and corrosion of a copper wiring exposed to the surface of the wafer.

The present invention has been made in view of these circumstances. The object of the present invention is to provide a substrate processing apparatus and a substrate processing method capable of preventing, when a substrate to be processed such as a semiconductor wafer is cleaned by a cleaning liquid containing hydrofluoro ether, formation of a watermark on a surface of the substrate to be processed and corrosion of a copper wiring exposed to the surface of the wafer.

The present invention is a substrate processing apparatus comprising: a chamber; a substrate holding mechanism disposed in the chamber, for holding a substrate to be processed; a cleaning-liquid supply unit that supplies a cleaning liquid containing hydrofluoro ether onto a substrate to be processed held by the substrate holding mechanism; and a gas supply unit that supplies a gas into the chamber, the gas being configured to prevent moisture from being adhered to a substrate to be processed when a cleaning liquid containing hydrofluoro ether is supplied onto the substrate to be processed.

In addition, the present invention is a substrate processing method comprising the steps of: filling a chamber with a gas, the gas being configured to prevent moisture from being adhered to a substrate to be processed when a cleaning liquid containing hydrofluoro ether is supplied onto the substrate to be processed; and supplying a cleaning liquid containing hydrofluoro ether onto a substrate to be processed placed in the chamber that is filled with the gas.

Since hydrofluoro ether is highly volatile, when the cleaning liquid containing hydrofluoro ether is supplied to the substrate to be processed, a heat of the substrate to be processed is taken away by evaporation of the cleaning liquid so that a temperature of the substrate to be processed is lowered. However, according to the above-described substrate processing apparatus and the substrate processing method, the chamber is filled with the gas which is configured to prevent moisture from being adhered to the substrate to be processed when the cleaning liquid containing hydrofluoro ether is supplied onto the substrate to be processed. Thus, even when the temperature of the substrate to be processed is lowered, there is no possibility that moisture is adhered to the substrate to be processed. Therefore, when the substrate to be processed is cleaned by the cleaning liquid containing hydrofluoro ether, it is possible to prevent formation of a watermark on a surface of the substrate to be processed and corrosion of a copper wiring exposed to the surface of the wafer.

In the above-described substrate processing apparatus, it is preferable that the substrate processing apparatus further comprises a control unit that controls the cleaning-liquid supply unit and the gas supply unit such that the gas is previously supplied from the gas supply unit into the chamber to fill the chamber with the gas, when the cleaning liquid containing hydrofluoro ether is supplied from the cleaning-liquid supply unit onto the substrate to be processed held by the substrate holding mechanism. In this case, when the cleaning liquid containing hydrofluoro ether is supplied onto the substrate to be processed, the above specific gas can be reliably filled in the chamber.

In the above-described substrate processing apparatus and the substrate processing method, it is preferable that the gas is a nitrogen gas or an air having a humidity lower than a humidity of an atmospheric air outside the chamber. In this case, even when a temperature of the substrate to be processed is lowered by supplying the cleaning liquid containing hydrofluoro ether onto the substrate to be processed, an amount of moisture to be adhered to the substrate to be processed can be decreased because of the lower humidity of the nitrogen gas or the air in the chamber than a humidity of the atmospheric air.

In the above-described substrate processing apparatus and the substrate processing method, it is preferable that the gas is a nitrogen gas or an air having a temperature lower than a temperature of an atmospheric air outside the chamber. In this case, since the temperature in the camber is previously lowered, when the cleaning liquid containing hydrofluoro ether is supplied to the substrate to be processed, a temperature of the substrate to be processed is difficult to be lowered, so that moisture in the gas in the chamber is prevented from being adhered to the substrate to be processed.

In the above-described substrate processing apparatus and the substrate processing method, it is preferable that the gas is formed of a vapor of hydrofluoro ether. In this case, since an atmosphere in the chamber is a vapor of hydrofluoro ether, when the cleaning liquid containing hydrofluoro ether is supplied onto the substrate to be processed, the cleaning liquid containing hydrofluoro ether that has been supplied onto the substrate to be processed is difficult to be evaporated, so that a heat of the substrate to be processed becomes difficult to be taken away therefrom. Therefore, a temperature of the substrate to be processed is difficult to be lowered, so that an amount of moisture to be adhered to the substrate to be processed can be significantly suppressed.

In the above-described substrate processing apparatus, it is preferable that the substrate processing apparatus further comprises a cleaning-liquid cooling mechanism that cools the cleaning liquid containing hydrofluoro ether to be supplied from the cleaning-liquid supply unit onto a substrate to be processed. Alternatively, in the above-described substrate processing method, it is preferable that a temperature of the cleaning liquid containing hydrofluoro ether to be supplied onto a substrate to be processed is lower than a temperature of an atmospheric air outside the chamber.

When a cleaning liquid containing hydrofluoro ether of a normal temperature is supplied onto the substrate to be processed, the cleaning liquid of a normal temperature that has been supplied to the substrate to be processed is rapidly evaporated. On the other hand, when a cleaning liquid containing hydrofluoro ether of a lower temperature is supplied onto the substrate to be processed, since the cleaning liquid of a lower temperature that has been supplied to the substrate to be processed does not evaporate but remains thereon, a liquid film of the cleaning liquid is formed on the substrate to be processed. Namely, the cleaning liquid rests on the substrate to be processed for a longer period of time. In addition, after the cleaning liquid is supplied onto the substrate to be processed, even when particles, which have been removed from the substrate to be processed, rebound from an inner wall or the like of a cup in the chamber and adhere again to a surface of the substrate to be processed, the particles can be washed away together with the liquid film of the cleaning liquid when the liquid film of the cleaning liquid is washed away by rotating the substrate to be processed. In addition, due to the formation of the liquid film of the cleaning liquid on the substrate to be processed, the surface of the substrate to be processed can be uniformly dried. That is to say, when the cleaning liquid containing hydrofluoro ether of a lower temperature is supplied onto a substrate to be processed, a processing efficiency of the substrate to be processed can be further improved.

In the above-described substrate processing apparatus, it is preferable that the substrate processing apparatus further comprises a temperature-adjusting unit that returns a temperature of the substrate to be processed to a temperature that is substantially the same as a temperature of an atmospheric air outside the chamber under a humidity lower than that of the atmospheric air, when the cleaning liquid containing hydrofluoro ether is supplied from the cleaning-liquid supply unit onto the substrate to be processed to lower the temperature of the substrate to be processed. Alternatively, in the above-described substrate processing method, it is preferable that the substrate processing method further comprises a step of returning a temperature of the substrate to be processed, the temperature having been lowered by supplying the cleaning liquid containing hydrofluoro ether onto the substrate to be processed, to a temperature that is substantially the same as a temperature of an atmospheric air outside the chamber under a humidity lower than a humidity of the atmospheric air. In this manner, when the lowered temperature of the substrate to be processed is returned to a temperature that is substantially the same as a temperature of an atmospheric air, it can be prevented that water droplets adhere to the substrate to be processed resulting in dew formation, because of the lower humidity of the substrate to be processed than that of the atmospheric air.

In the above-described substrate processing apparatus, it is further preferable that the temperature-adjusting unit is formed of a gas heating mechanism that heats a gas supplied from the gas supply unit into the chamber, and a temperature of the substrate to be processed is returned to a temperature that is substantially the same as a temperature of an atmospheric air outside the chamber, by sending a gas heated by the gas heating mechanism from the gas supply unit into the chamber, after the cleaning liquid containing hydrofluoro ether is supplied onto the substrate to be processed from the cleaning-liquid supply unit.

Alternatively, it is further preferable that the temperature-adjusting unit is formed of a substrate heating mechanism disposed on the substrate holding mechanism, and a temperature of the substrate to be processed is returned to a temperature that is substantially the same as a temperature of an atmospheric air outside the chamber, by heating the substrate to be processed by the substrate heating mechanism, after the cleaning liquid containing hydrofluoro ether is supplied onto the substrate to be processed from the cleaning-liquid supply unit.

Alternatively, there may disposed a substrate-temperature adjusting chamber disposed outside the chamber, the substrate-temperature adjusting chamber being filled with a gas having a humidity lower than a humidity of an atmospheric air outside the chamber and a temperature that is substantially the same as a temperature of the atmospheric air. In addition, it is preferable that there is disposed a substrate transfer mechanism that transfers a substrate to be processed from the chamber to the substrate-temperature adjusting chamber, and that, after the cleaning liquid containing hydrofluoro ether is supplied onto a substrate to be processed from the cleaning-liquid supply unit, a temperature of the substrate to be processed is returned to a temperature that is substantially the same as a temperature of the atmospheric air outside the chamber, by transferring the substrate to be processed by the substrate transfer mechanism from the chamber to the substrate-temperature adjusting chamber.

In the above-described substrate processing apparatus, it is preferable that the substrate processing apparatus further comprises an ultrasonic-wave imparting mechanism that imparts ultrasonic vibrations to the cleaning liquid containing hydrofluoro ether to be supplied from the cleaning-liquid supply unit onto a surface of the substrate to be processed. Since ultrasonic vibrations are imparted to the cleaning liquid containing hydrofluoro ether, an ultrasonic vibration energy can be additionally given to the cleaning liquid, so that particles resting in minute recesses in the substrate to be processed can be more favorably removed.

In the above-described substrate processing apparatus, it is preferable that the substrate processing apparatus further comprises: a further gas supply unit for generating liquid droplets that supplies a gas for generating liquid droplets; and a binary fluid nozzle in which the cleaning liquid containing hydrofluoro ether, which is supplied from the cleaning-liquid supply unit, and a gas for generating liquid droplets, which is supplied from the further gas supply unit for generating liquid droplets, are mixed with each other to generate liquid droplets containing hydrofluoro ether, the binary fluid nozzle spraying the liquid droplets onto a substrate to be processed held by the substrate holding mechanism. By using the binary fluid nozzle, fine liquid droplets of hydrofluoro ether can be sprayed onto the substrate to be processed. Thus, particles adhering to a surface of the substrate to be processed can be physically removed by the dynamic energy of the droplets, whereby a cleaning ability for the substrate to be processed can be enhanced.

DETAILED DESCRIPTION OF THE INVENTION

Figure 1:
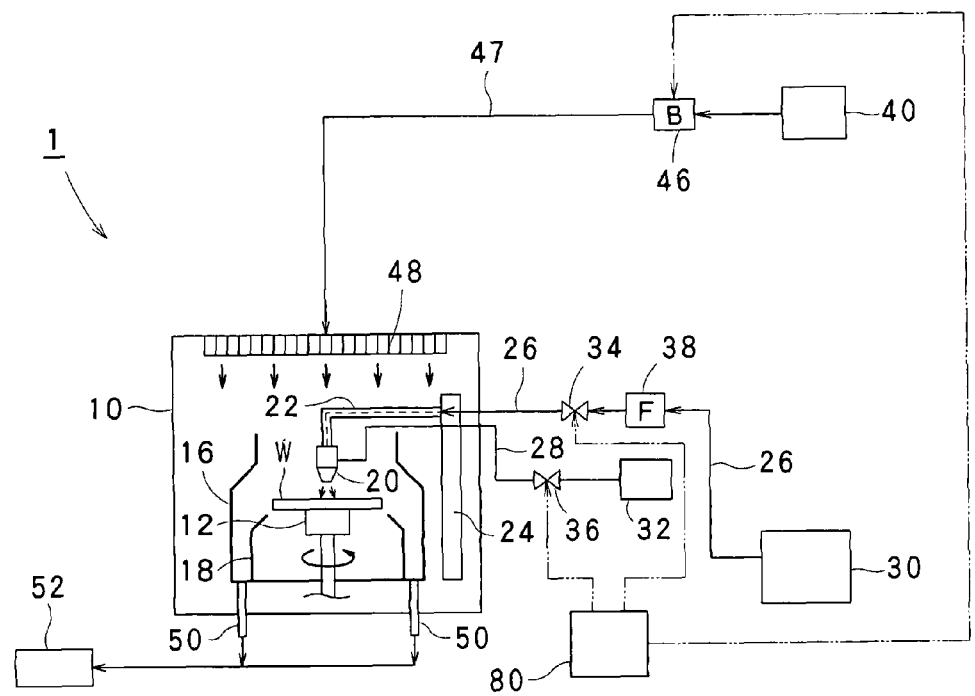
FIG. 1 is a schematic structural view showing a structure of a substrate processing apparatus in one embodiment of the present invention.
Figure 2:
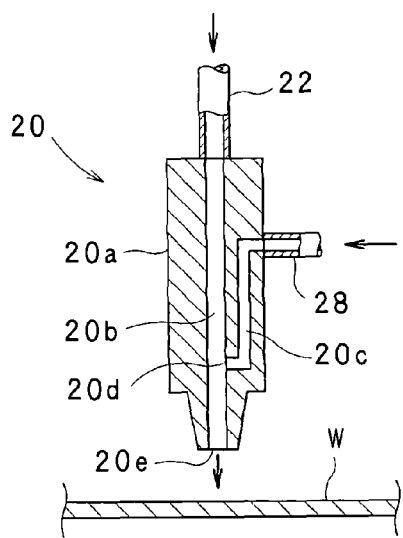
FIG. 2 is a sectional view showing a detailed structure of a binary fluid nozzle of the substrate processing apparatus shown in FIG. 1.
Figure 3:
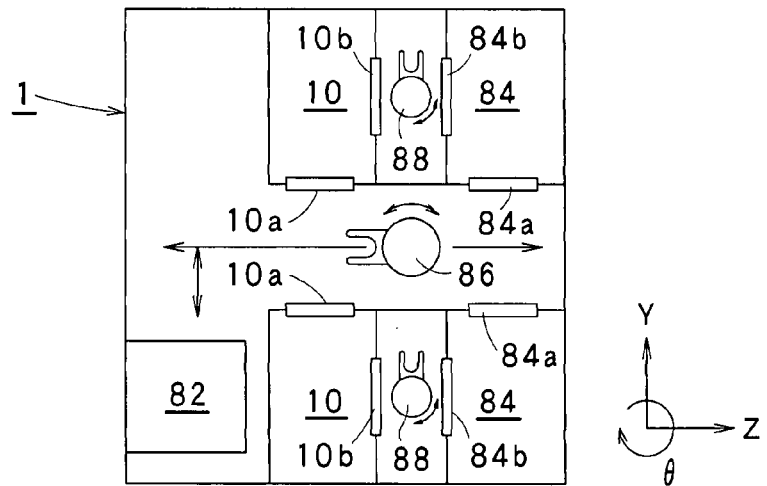
FIG. 3 is a top view showing the substrate processing apparatus shown in FIG. 1 when viewed from above.

An embodiment of the present invention will be described below with reference to the drawings. FIGS. 1 to 3 show a substrate processing apparatus in one embodiment of the present invention.

FIG. 1 is a schematic structural view showing a structure of a substrate processing apparatus in one embodiment of the present invention. FIG. 2 is a sectional view showing a detailed structure of a binary fluid nozzle of the substrate processing apparatus shown in FIG. 1. FIG. 3 is a top view showing the substrate processing apparatus shown in FIG. 1 when viewed from above.

At first, a schematic structure of a substrate processing apparatus 1 in this embodiment is described with reference to FIG. 1. An overall structure of the substrate processing apparatus 1 shown in FIG. 3 is described hereafter. The substrate processing apparatus 1 is an apparatus for cleaning a surface of a substrate to be processed such as a semiconductor wafer (hereinafter also referred to simply as "wafer") W.

The substrate processing apparatus 1 includes a chamber 10, and a spin chuck 12 disposed in the chamber 10 for holding a wafer W. In the substrate processing apparatus 1, there is installed a cleaning-liquid supply unit that supplies a cleaning liquid containing hydrofluoro ether (hereinafter also referred to simply as "HFE") onto a wafer W held by the spin chuck 12. There is also installed a gas supply unit that supplies into the chamber 10 a gas which is configured to prevent moisture from being adhered to a wafer W when a cleaning liquid containing HFE is supplied onto the wafer W. In addition, the substrate processing apparatus 1 includes a control unit 80 that controls the cleaning-liquid supply unit and the gas supply unit. Further, disposed in the substrate processing apparatus 1 is a temperature adjusting unit that returns a temperature of a wafer W to a temperature that is substantially the same as a temperature of an atmospheric air outside the chamber 10 under a humidity lower than that of the atmospheric air, when a cleaning liquid containing HFE is supplied from the cleaning-liquid supply unit onto the wafer W to lower the temperature of the same.

Next, details of the respective constituent elements of the substrate processing apparatus 1 shown in FIG. 1 are described below.

The spin chuck 12 is adapted to substantially horizontally hold a wafer W and rotating the same. Specifically, the spin chuck 12 includes a vertically extended rotational shaft, and a discoid spin base attached to an upper end of the rotational shaft. When a wafer W is held by the spin chuck 12, the wafer W is placed on an upper surface of the spin base. The rotational shaft is provided with a spin-chuck driving mechanism (not shown) which is capable of rotating the rotational shaft about a rotational axis of the spin-chuck driving mechanism. Thus, a wafer W held by the spin chuck 12 can be rotated in a horizontal plane. The spin chuck 12 is also capable of vertically reciprocating by a spin-chuck elevating mechanism (not shown). Thus, when a wafer W is loaded and held by the spin chuck 12, and a wafer W placed on the spin chuck 12 is unloaded, an upper end of the spin chuck 12 can be moved to a position higher than an upper end of an outer cylinder 16 (described below). On the other hand, when a cleaning liquid containing HFE is supplied onto a wafer W held by the spin chuck 12 from a binary fluid nozzle 20 (described below), a sidewall of the outer cylinder 16 can be moved at a position lateral to the wafer W held by the spin chuck 12. The spin-chuck driving mechanism and the spin-chuck elevating mechanism are respectively controlled by the control unit 80.

Disposed in the chamber 10 are the substantially cylindrical outer cylinder 16 and an inner cylinder 18 arranged inside the outer cylinder 16, such that the side of the spin chuck 12 is surrounded. Central axes of the outer cylinder 16 and the inner cylinder 18 are substantially corresponding to a central axis of the rotational shaft of the spin chuck 12. Lower ends of the respective outer cylinder 16 and the inner cylinder 18 are equipped with bottom plates, while upper ends thereof are opened. As shown in FIG. 1, an upper end of the outer cylinder 16 is higher than an upper end of the inner cylinder 18.

One end of a cleaning-liquid discharging pipe 50 is connected to the bottom plate of the outer cylinder 16 at a position between the outer cylinder 16 and the inner cylinder 18. The other end of the cleaning-liquid discharging pipe 50 is connected to a cleaning-liquid discharging unit 52. A cleaning liquid, which has been used for cleaning a wafer W and sent to the bottom plate of the outer cylinder 16, is configured to flow into the cleaning-liquid discharging unit 52 through the cleaning-liquid discharging pipe 50. The cleaning liquid containing HFE that has been sent to the cleaning-liquid discharging unit 52 is collected to be reused, or sent outside the substrate processing apparatus 1 to be discarded.

The binary fluid nozzle 20 facing downward is disposed in the chamber 10 at a position above a wafer W which is held by the spin chuck 12. The binary fluid nozzle 20 is connected to a rotational shaft 24 via an arm 22. A cleaning-liquid flow path (see, the dotted line shown in FIG. 1) communicating with an inside space of the binary fluid nozzle 20 is formed in the arm 22. The rotational shaft 24 is provided with an arm driving mechanism (not shown) for rotating the rotational shaft 24 in both clockwise and counterclockwise directions. When the arm driving mechanism horizontally swings the arm 22 about the rotational shaft 24, the binary fluid nozzle 20 can be moved in a reciprocating manner along a horizontal plane within a range between a position above a center of a wafer W (see, FIG. 1) and a position outside a periphery of the wafer W. The arm driving mechanism is also capable of vertically moving the rotational shaft 24 in a reciprocating manner. Thus, a distance between a distal end of the binary fluid nozzle 20 and a wafer W held by the spin chuck 12 can be adjusted within a range between, e.g., 5 mm and 50 mm.

A binary fluid nozzle is generally a nozzle for spraying fine droplets which are generated by mixing a gas and a liquid. In this embodiment, supplied to the binary fluid nozzle 20 are a cleaning liquid containing HFE through the cleaning-liquid flow path arranged inside the arm 22, and a nitrogen gas from a nitrogen-gas supply pipe 28 (described below). Details of a structure of the binary fluid nozzle 20 are described with reference to FIG. 2. As shown in FIG. 2, the binary fluid nozzle 20 includes a substantially columnar nozzle body 20a made of, e.g., a fluorine resin. Inside the nozzle body 20a, there are disposed a cleaning-liquid flow path 20b communicating with the cleaning-liquid flow path inside the arm 22, and a nitrogen-gas flow path 20c communicating with the nitrogen-gas supply pipe 28. The cleaning-liquid flow path 20b and the nitrogen-gas supply path 20c are merged at a three-way merging point 20d inside the nozzle body 20a. An inside flow path is further extended from the merging point 20d to a discharge port 20e of the binary fluid nozzle 20.

At the merging point 20d of the nozzle body 20a in the binary fluid nozzle 20, a cleaning liquid containing HFE, which has been sent from the cleaning-liquid flow path inside the arm 22 to the cleaning-liquid flow path 20b, and a nitrogen gas, which has been sent from the nitrogen-gas supply pipe 28 to the nitrogen-gas flow path 20c, collide with each other to be mixed together, so that droplets containing HFE are generated at the merging point 20d. Then, the droplets containing HFE are sprayed onto a wafer W through the discharge port 20e.

As shown in FIG. 1, a cleaning-liquid supply pipe 26 is connected to the arm 22. A cleaning liquid containing HFE that has been supplied from the cleaning-liquid supply pipe 26 is sent to the cleaning-liquid flow path inside the arm 22. A cleaning liquid tank 30, in which a cleaning liquid containing HFE is stored, is disposed on an upstream end of the cleaning-liquid supply pipe 26. A cleaning liquid containing HFE is sent from the cleaning liquid tank 30 to the cleaning-liquid supply pipe 26 by a pressure feeding unit, not shown. Disposed in the cleaning-liquid supply pipe 26 are a valve 34 whose opening degree can be adjusted, and a filter 38 for removing particles. Opening and closing of the valve 34 is adjusted by the control unit 80. The cleaning liquid tank 30, the cleaning-liquid supply pipe 34, the valve 34, and so on constitute the cleaning-liquid supply unit.

The nitrogen-gas supply pipe 28 is connected to the binary fluid nozzle 20. A nitrogen-gas supply unit 32 is disposed on an upstream end of the nitrogen-gas supply pipe 28. The nitrogen-gas supply unit 32 is capable of supplying a highly pressurized nitrogen gas to the nitrogen-gas supply pipe 28. The nitrogen gas supply pipe 28 is provided with a valve 36 that is controlled by the control unit 80. By changing an opening degree of the valve 36 to change a pressure (flowrate) of a nitrogen gas to be supplied to the binary fluid nozzle 20, a diameter of a droplet of HFE generated in the binary fluid nozzle 20 can be changed. Thus, a process ability for a wafer W processed by the droplets of HFE can be changed. The nitrogen-gas supply unit 32, the nitrogen-gas supply pipe 28, and the valve 36 constitute a gas supply unit for generating liquid droplets that supplies a gas for generating liquid droplets.

A gas supply unit for supplying a specific gas into the chamber 10 is disposed above the cleaning liquid tank 30. To be specific, the gas supply unit is composed of a dry air generator 40 for generating a dry air, a gas supply pipe 47 for supplying a dry air from the dry air generator 40 into the chamber 10, and a blower 46 disposed in the gas supply pipe 47.

The blower 46 is configured to send a dry air generated in the dry air generator 40 into the chamber 10 through the gas supply pipe 47. Since a filter 48 is disposed above the chamber 10, particles included in the dry air, which is sent from the gas supply pipe 47 into the chamber 10, are removed by the filter 48. The blower 46 is controlled by the control unit 80.

As described above, the control unit 80 controls drive of the blower 46, the valves 34 and 36, the spin-chuck driving mechanism (not shown), the spin-chuck elevating mechanism (not shown), and the arm driving mechanism (not shown).

With respect to the substrate processing apparatus 1 whose schematic structure is shown in FIG. 1, a top view showing an overall structure thereof when viewed from above is shown in FIG. 3. The overall structure of the substrate processing apparatus is described with reference to FIG. 3.

As shown in FIG. 3, the substrate processing apparatus 1 includes: a transit unit (TRS; Transit Station) 82 in which a wafer W that has been sent from a cassette (not shown) located outside is temporarily placed; two chambers 10 each of the schematic structure is shown in FIG. 1; and substrate-temperature adjusting chamber 84 arranged near the respective chambers 10. The substrate-temperature adjusting chamber 84 is filled with a gas having a humidity lower than that of an atmospheric air outside the chamber 10 and a temperature that is substantially the same as a temperature of the atmospheric air, namely, a dry air of a normal temperature, for example. Disposed in the substrate-temperature adjusting chamber 84 is a stage (not shown) on which a wafer W is temporarily placed.

Each chamber 10 is equipped with a shutter 10a and a shutter 10b through which a wafer W is loaded and unloaded. When the shutters 10a and 10b are closed, each chamber 10 can be hermetically sealed. Each substrate-temperature adjusting chamber 84 is equipped with a shutter 84a and a shutter 84b. When the shutters 84a and 84b are closed, each substrate-temperature adjusting chamber 84 can be hermetically sealed.

The substrate processing apparatus 1 includes a first wafer transfer mechanism (CRA) 86 that transfers a wafer W which is temporarily placed in the transit unit 82 to the respective chambers 10, and returns a wafer W from the respective chambers 10 or the respective substrate-temperature adjusting chambers 84 to the transit unit 82. In a housing of the substrate processing apparatus 1, the first wafer transfer mechanism 86 is capable of moving in two directions, i.e., in an X direction and a Y direction in FIG. 3, and is capable of rotating in an X-Y plane (in a θ direction in FIG. 3). The first wafer transfer mechanism 86 is provided with a horizontally stretchable arm. When a wafer W is transferred by the first wafer transfer mechanism 86, the shutter 10a or the shutter 84a is temporality opened.

Further, in a space between each chamber 10 and the substrate-temperature adjusting chamber 84 corresponding thereto, there is disposed a second wafer transfer mechanism 88 that transfers a wafer W placed in the chamber 10 to the substrate-temperature adjusting chamber 84. The second wafer transfer mechanism 88 is capable of moving in the two directions, i.e., in the X direction and the Y direction in FIG. 3, and is capable of rotating in the X-Y place (in the θ direction in FIG. 3). The second wafer transfer mechanism 88 is provided with a horizontally stretchable arm. When a wafer W is transferred by the second wafer transfer mechanism 88, the shutter 10*b* and the shutter 84*b* are temporarily opened.

Driving of the shutters 10*a*, 10*b*, 84*a* and 84*b*, the first wafer transfer mechanism 86, and the second wafer transfer mechanism 88 is respectively controlled by the control unit 80.

Next, an operation of the substrate processing apparatus 1 as structured above is described.

At first, there is performed a step in which a dry air is supplied into the chamber 10. Specifically, the blower 46 is controlled to be driven by the control unit 80. Thus, a dry air generated by the dry air generator 40 is supplied by the blower 46 into the chamber 10 through the gas supply pipe 47 and the filter 48.

Then, there is performed a step in which a cleaning liquid containing HFE is supplied onto a wafer W placed in the chamber 10 which is filled with the dry air. Specifically, a wafer W is transferred by the first wafer transfer mechanism 86 from the transit unit 82 to the spin chuck 12 in the chamber 10. Then, the valves 34 and 36 are controlled to be simultaneously opened by the control unit 80. Thus, a cleaning liquid containing HFE and a nitrogen gas is simultaneously supplied to the binary fluid nozzle 20, and liquid droplets containing HFE are sprayed from the binary fluid nozzle 20 onto the wafer W on the spin chuck 12. The wafer W is processed in the above manner.

Since HFE is a highly volatile liquid, when the liquid droplets of HFE are supplied onto the wafer W, a heat of the wafer W is taken away by evaporation of the HFE so as to lower a temperature of the wafer W.

Thereafter, there is performed a step in which, under conditions of a humidity lower than that of an atmospheric air outside the chamber 10, the lowered temperature of the wafer W is returned to a temperature that is substantially the same as a temperature of the atmospheric air. Specifically, the shutter 10*b* of the chamber 10 and the shutter 84*b* of the substrate-temperature adjusting chamber 84 are controlled to be opened by the control unit 80, and the wafer W held on the spin chuck 12 in the chamber 10 is conveyed by the second wafer transfer mechanism 88 to the stage (not shown) disposed in the substrate-temperature adjusting chamber 84. As described above, an atmosphere inside the substrate-temperature adjusting chamber 84 is the dry air having a temperature that is substantially the same as a temperature of the outside atmospheric air. Thus, in the substrate-temperature adjusting chamber 84, the temperature of the wafer W is returned to a temperature that is substantially the same as a temperature of the atmospheric air outside the chamber 10. Since the atmosphere inside the substrate-temperature adjusting chamber 84 is the dry air, there is no possibility that water droplets adhere to the wafer W resulting in dew formation.

Finally, the shutter 84*a* of the substrate-temperature adjusting chamber 84 is controlled to be opened by the control unit 80, and the wafer W in the substrate-temperature adjusting chamber 84 is returned to the transit unit 82 by the first wafer transfer mechanism 86. In this manner, a series of steps in the substrate processing apparatus 1 is completed.

As described above, according to the substrate processing apparatus 1 and the substrate processing method in this embodiment, a dry air is supplied into the chamber 10 at first, and then a cleaning liquid containing HFE is supplied onto a wafer W in the chamber 10 which is filled with the dry air.

Since HFE is a highly volatile liquid, when the liquid droplets of HFE are supplied onto the wafer W, a heat of the wafer W is taken away by evaporation of the HFE so as to lower a temperature of the wafer W. However, since the chamber 10 is filled with the dry air, even when the temperature of the wafer W is lowered, there is no possibility that water droplets adhere to the wafer W resulting in dew formation. Therefore, when the wafer W is cleaned by a cleaning liquid containing HFE, formation of a watermark on the surface of the wafer W and corrosion of a copper wiring exposed to the surface of the wafer W can be restrained.

A gas to be supplied into the chamber 10 beforehand is not limited to a dry air, and the gas may be another gas, such as a nitrogen gas or an air, whose humidity is lower than that of an atmospheric air outside the chamber 10. To be specific, in place of the dry air generator 40, there may be installed a low-humid nitrogen gas generator for generating a nitrogen gas having a humidity lower than that of an atmospheric air outside the chamber 10.

In addition, a gas which is filled in the substrate-temperature adjusting chamber 84 is not limited to a dry air, and there may be used another gas, provided that the gas has a humidity lower than that of an atmospheric air outside the chamber 10 and a temperature substantially the same as that of the atmospheric air.

Due to the use of the binary fluid nozzle 20 as described above, fine liquid droplets of HFE can be sprayed onto a wafer W. Thus, particles adhering to a surface of the wafer W can be physically removed by a kinetic energy of the liquid droplets, whereby a cleaning ability for the wafer W can be improved.

Figure 4:
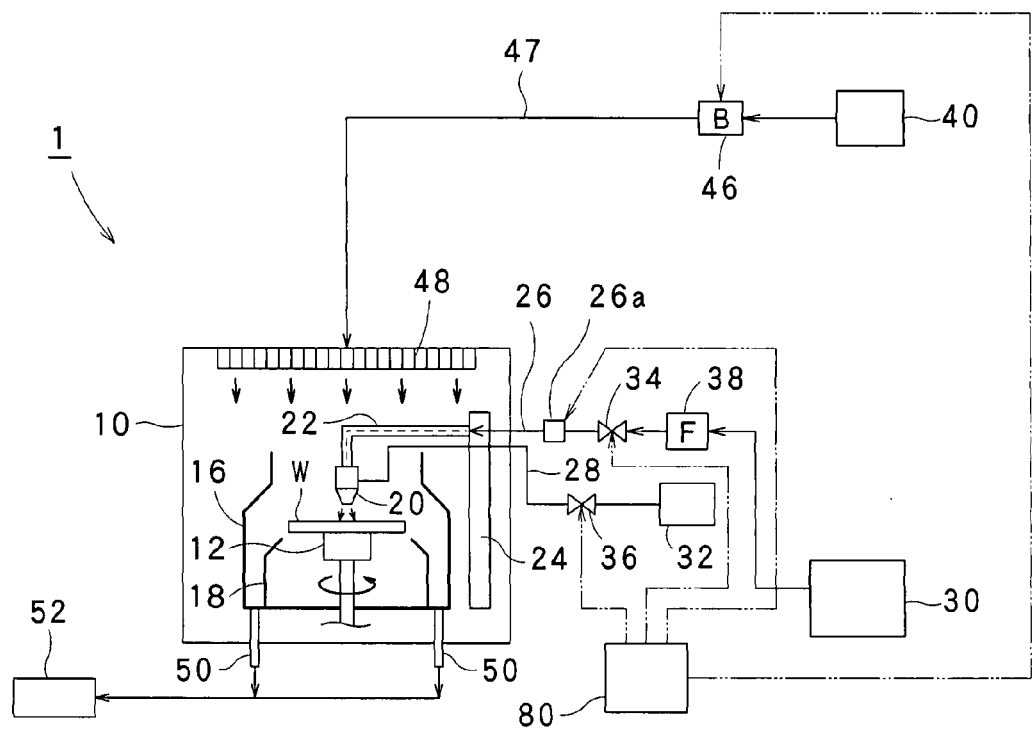
FIG. 4 is a schematic structural view showing another structure of the substrate processing apparatus of the present invention.

The substrate processing apparatus 1 in this embodiment is not limited to the above structure, and can be variously changed. FIG. 4 is a schematic structural view showing another structure of the substrate processing apparatus 1 of this invention.

The substrate processing apparatus 1 shown in FIG. 4 differs from the substrate processing apparatus 1 shown in FIGS. 1 to 3 only in that a cleaning-liquid cooling mechanism 26*a* is disposed in the cleaning-liquid supply pipe 26. Other structures of the substrate processing apparatus 1 shown in FIG. 4 are substantially the same as those of the substrate processing apparatus 1 shown in FIGS. 1 to 3.

In the following description of an alternative example of the substrate processing apparatus 1 shown in FIG. 4, the same parts as those of the substrate processing apparatus shown in FIGS. 1 to 3 are shown by the same reference numbers, and their detailed description is omitted.

In FIG. 4, the cleaning-liquid cooling mechanism 26*a* is formed of a dual tube, for example. A cleaning liquid containing HFE sent from the cleaning liquid tank 30 flows through an inner tube of the dual tube, while a cooling water flows through an outer tube of the dual tube in a reverse direction. Owing to the provision of the cleaning-liquid cooling mechanism 26*a*, a temperature of the cleaning liquid containing HFE to be sent to the binary fluid nozzle 20 can be sufficiently lowered, as compared with a temperature of an atmospheric air outside the chamber 10, to a temperature not more than 5° C., for example. Thus, a temperature of liquid droplets of HFE sprayed from the binary fluid nozzle 20 onto a wafer W becomes not more than, e.g., 5° C. The cleaning-liquid cooling mechanism 26*a* is controlled by the control unit 80. Specifically, the control unit 80 determines whether to pass a cooling water through the outer tube of the dual tube in the cleaning-liquid cooling mechanism 26*a* or not.

In the step of supplying a cleaning liquid containing HFE onto a wafer W, when the cleaning-liquid cooling mechanism 26*a* is turned on by the control unit 80, liquid droplets of HFE whose temperature is sufficiently lower than that of an atmospheric air outside the chamber 10 are sprayed onto the wafer W. When liquid droplets of HFE of a normal temperature are supplied onto the wafer W, the cleaning liquid containing HFE, which has been sprayed onto the wafer W, immediately evaporates. On the other hand, liquid droplets of HFE whose temperature has been lowered by the cleaning-liquid cooling mechanism 26a are supplied onto a wafer W, the cleaning liquid containing HFE sprayed from the binary fluid nozzle 20 onto the wafer W does not evaporate but remains thereon. Thus, a liquid film of the cleaning liquid containing HFE is formed on the wafer W. Thus, the cleaning liquid rests on the wafer W for a longer period of time. After the cleaning liquid is sprayed onto a wafer W, even when particles, which have been removed from the wafer W, rebound from an inner wall of the outer cylinder 16 or the like and adhere again to a surface of the wafer W, the particles can be washed away together with the liquid film of the cleaning liquid when the liquid film of the cleaning liquid is washed away by rotating the wafer W. In addition, due to the formation of the liquid film of the cleaning liquid on the wafer W, the surface of the wafer W can be uniformly dried. That is to say, when the cleaning liquid containing HFE of a lower temperature is supplied onto a wafer W, a processing efficiency of the wafer W can be further improved.

The cleaning-liquid cooling mechanism 26a is not necessarily installed to spray a cooled cleaning liquid from the binary fluid nozzle 20 onto a wafer W. Alternatively, a cooled cleaning liquid containing HFE can be directly sent into the binary fluid nozzle 20 from an independently disposed cooled HFE cleaning-liquid supply unit.

Figure 5:
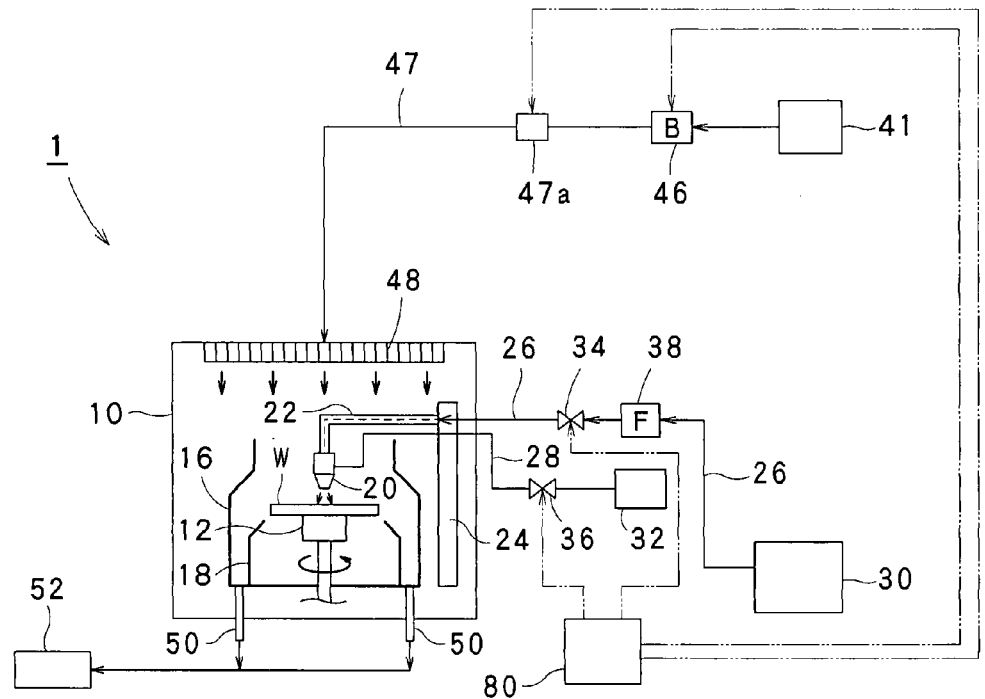
FIG. 5 is a schematic structural view showing still another structure of the substrate processing apparatus of the present invention.

Still another structure of the substrate processing apparatus 1 is described with reference to FIG. 5. FIG. 5 is a schematic structural view showing still another structure of the substrate processing apparatus 1 of the present invention.

To be specific, the substrate processing apparatus shown in FIG. 5 differs from the substrate processing apparatus 1 shown in FIGS. 1 to 3 only in that, in place of the dry air generator 40 for generating a dry air to be supplied into the chamber 10, an air generator 41 is disposed for generating an air that is the same as an atmospheric air, and a gas cooling mechanism 47a is additionally disposed in the gas supply pipe 47. Other structures of the substrate processing apparatus 1 shown in FIG. 5 are substantially the same as those of the substrate processing apparatus 1 shown in FIGS. 1 to 3.

In the following description of an alternative example of the substrate processing apparatus 1 shown in FIG. 5, the same parts as those of the substrate processing apparatus shown in FIGS. 1 to 3 are shown by the same reference numbers, and their detailed description is omitted.

The air generator 41 is capable of generating an air having substantially the same humidity and temperature as those of an atmospheric air outside the chamber 10.

The gas cooling mechanism 47a is formed of, e.g., a heat exchanger, and cools an air that has been generated by the air generator 41 and sent to the gas supply pipe 47 by the blower 46. Due to the provision of the gas cooling mechanism 47a, a temperature of the air to be supplied into the chamber 10 is sufficiently lowered as compared with an atmospheric air outside the chamber 10. Thus, by using the gas cooling mechanism 47a, the chamber 10 can be previously filled with an air of a lower temperature, when the liquid droplets of HFE are sprayed onto a wafer W. The gas cooling mechanism 47 is controlled by the control unit 80.

At a step of supplying an air generated by the air generator 41 into the chamber 10, when the control unit 80 turns on the gas cooling mechanism 47a, the inside of the chamber 10 is filled with an air whose temperature is sufficiently lower than that of an atmospheric air outside the chamber 10. Since the temperature of the chamber 10 is lowered, when droplets of HFE are sprayed onto a wafer W, a temperature of the wafer W is difficult to be lowered. Thus, an amount of moisture adhered to the wafer W, which is caused by liquefaction of water vapor in the air in the chamber 10, can be further decreased. Therefore, formation of a watermark on a surface of the wafer W and corrosion of a copper wiring exposed to the surface of the wafer W can be more reliably prevented.

It is not always necessary to cool an air sent from the air generator 41 by the gas cooling mechanism 47a, when the air of a lower temperature is filled in the chamber 10. Alternatively, the air generator 41 may generate a cooled air beforehand, and the cooled air may be directly sent from the air generator 41 into the chamber 10.

The gas to be previously supplied into the chamber 10 is not limited to a cooled air, and there may be used another gas, such as a nitrogen gas, whose temperature is lower than that of an air outside the chamber 10. Specifically, a nitrogen gas generator may be installed in place of the air generator 41.

In the substrate processing apparatus 1 shown in FIG. 5, the cleaning-liquid cooling mechanism 26a shown in FIG. 4 may be additionally disposed in the cleaning liquid supply pipe 26. In this case, a temperature of liquid droplets of HFE to be sprayed onto a wafer W can be sufficiently lowered as compared with a temperature of an atmospheric air outside the chamber 10, whereby the same effects as those produced by the substrate processing apparatus 1 shown in FIG. 4 can be provided.

In the substrate processing 1 shown in FIG. 4, the gas cooling mechanism 47a shown in FIG. 5 may be disposed in the gas supply pipe 47.

Figure 6:
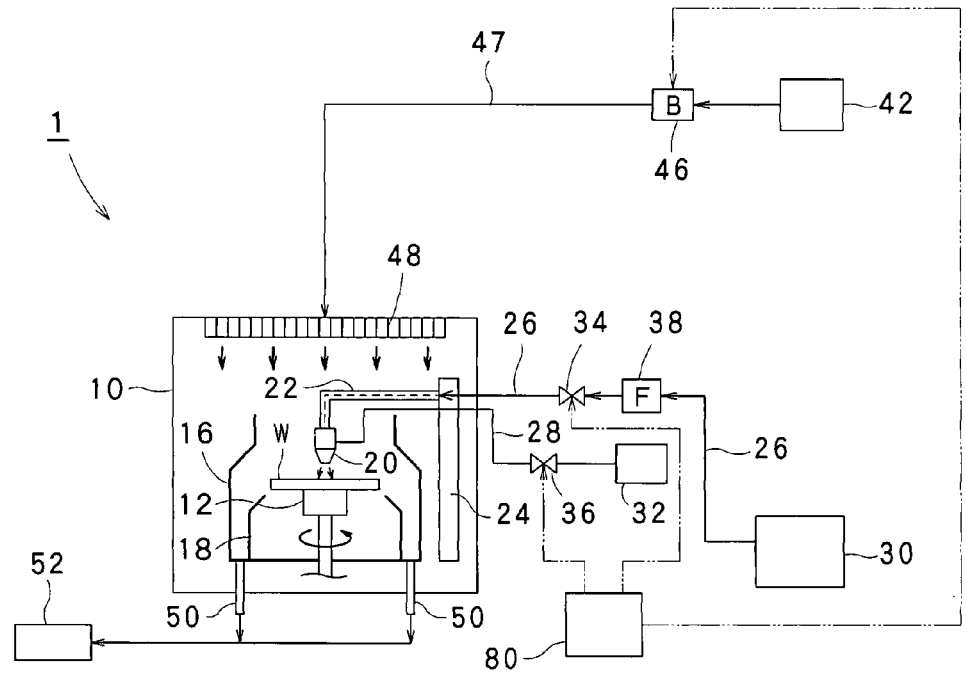
FIG. 6 is a schematic structural view showing still another structure of the substrate processing apparatus of the present invention.

Still another structure of the substrate processing apparatus 1 is described with reference to FIG. 6. FIG. 6 is a schematic structural view showing still another structure of the substrate processing apparatus 1 of the present invention.

To be specific, the substrate processing apparatus 1 shown in FIG. 6 differs from the substrate processing apparatus 1 shown in FIGS. 1 to 3 only in that, in place of the dry air generator 40 for generating a dry air to be supplied into the chamber 10, an HFE vapor generator 42 is disposed for generating a vapor of HFE. Other structures of the substrate processing apparatus 1 shown in FIG. 6 are substantially the same as those of the substrate processing apparatus 1 shown in FIGS. 1 to 3.

In the following description of an alternative example of the substrate processing apparatus 1 shown in FIG. 6, the same parts as those of the substrate processing apparatus 1 shown in FIGS. 1 to 3 are shown by the same reference numbers, and their detailed description is omitted.

According to the substrate processing apparatus 1 shown in FIG. 6, an inside of the chamber 10 is previously filled with a vapor of HFE, when a cleaning liquid containing HFE is supplied onto a wafer W. Since an atmosphere in the chamber 10 is a vapor of HFE, when the cleaning liquid containing HFE is supplied onto the wafer W, the cleaning liquid of HFE that has been supplied onto the wafer W is difficult to be evaporated, so that a heat is difficult to be taken away from the wafer W. Thus, a temperature of the wafer W is difficult to be lowered, as well as an amount of moisture adhered to the wafer W can be remarkably decreased. Thus, when the wafer W is cleaned by the cleaning liquid containing HFE, formation of a watermark on a surface of the wafer W and corrosion of a copper wiring exposed to the surface of the wafer W can be prevented.

In the substrate processing apparatus shown in FIG. 6, the cleaning-liquid cooling mechanism 26a shown in FIG. 4 may be additionally disposed in the cleaning liquid supply pipe 26. In this case, a temperature of liquid droplets of HFE to be sprayed onto a wafer W can be sufficiently lowered as compared with a temperature of an atmospheric air outside the chamber 10, whereby the same effects as those produced by the substrate processing apparatus 1 shown in FIG. 4 can be provided.

Figure 7:
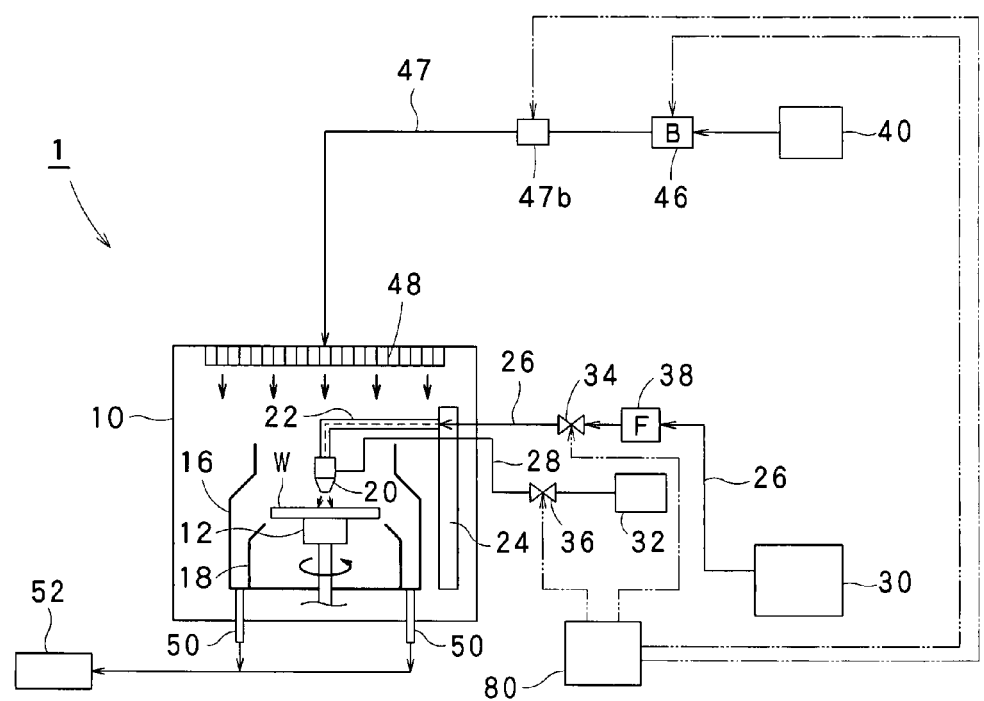
FIG. 7 is a schematic structural view showing still another structure of the substrate processing apparatus of the present invention.

Still another structure of the substrate processing apparatus 1 is described with reference to FIG. 7. FIG. 7 is a schematic structural view showing still another structure of the substrate processing apparatus 1 of the present invention.

To be specific, the substrate processing apparatus shown in FIG. 7 differs from the substrate processing apparatus 1 shown in FIGS. 1 to 3 only in that a gas heating mechanism 47b is additionally disposed in the gas supply pipe 47. Other structures of the substrate processing apparatus 1 shown in FIG. 7 are substantially the same as those of the substrate processing apparatus 1 shown in FIGS. 1 to 3.

In the following description of an alternative example of the substrate processing apparatus 1 shown in FIG. 7, the same parts as those of the substrate processing apparatus 1 shown in FIGS. 1 to 3 are shown by the same reference numbers, and their detailed description is omitted.

The gas heating mechanism 47b is formed of, e.g., a heat exchanger, and heats a dry air which has been generated by the dry air generator 40 and transferred to the gas supply pipe 47 by the blower 46. Due to the provision of the gas heating mechanism 47b, a dry air whose temperature is higher than that of an atmospheric air outside the chamber 10 can be selectively supplied into the chamber 10. The gas heating mechanism 47b is controlled by the control unit 80. The gas heating mechanism 47b is used only at a step in which a temperature of a wafer W, which has been lowered when a cleaning liquid containing HFE is sprayed onto the wafer W, is returned to a temperature that is substantially the same as a temperature of an atmospheric air outside the chamber 10.

According to the substrate processing apparatus 1 shown in FIG. 7, after a cleaning liquid containing HFE is supplied onto a wafer W, by supplying into the chamber 10 a high-temperature dry air that has been heated by the gas heating mechanism 47b, a temperature of the wafer W can be promptly returned to a temperature that is substantially the same as a temperature of an atmospheric air, in place of a case in which the wafer W is transferred from the chamber 10 to the substrate-temperature adjusting chamber 84 by the second wafer transfer mechanism 88. Also in such a substrate processing apparatus 1, similar to the case in which there are used the second wafer transfer mechanism 88 and the substrate-temperature adjusting chamber 84, which are shown in FIG. 3, when a lowered temperature of the wafer W is returned to a temperature that is substantially the same as a temperature of an atmospheric air, it can be prevented that water droplets adhere to the wafer W resulting in dew formation, because of a dried condition of the wafer W.

As an alternative way for supplying a dry air of a high temperature into the chamber 10, it is possible to directly send a heated dry air into the chamber 10 from an independently installed heated-dry air supply part. Alternatively, after a cleaning liquid containing HFE is supplied onto a wafer W, by supplying a dry air whose temperature is substantially the same as that of an atmospheric air outside the chamber 10 from the dry air generator 40 into the chamber 10 so as to replace an atmosphere in the chamber 10, a temperature of the wafer W in the chamber 10 may be returned to a temperature that is substantially the same as a temperature of an atmospheric air.

Figure 8:
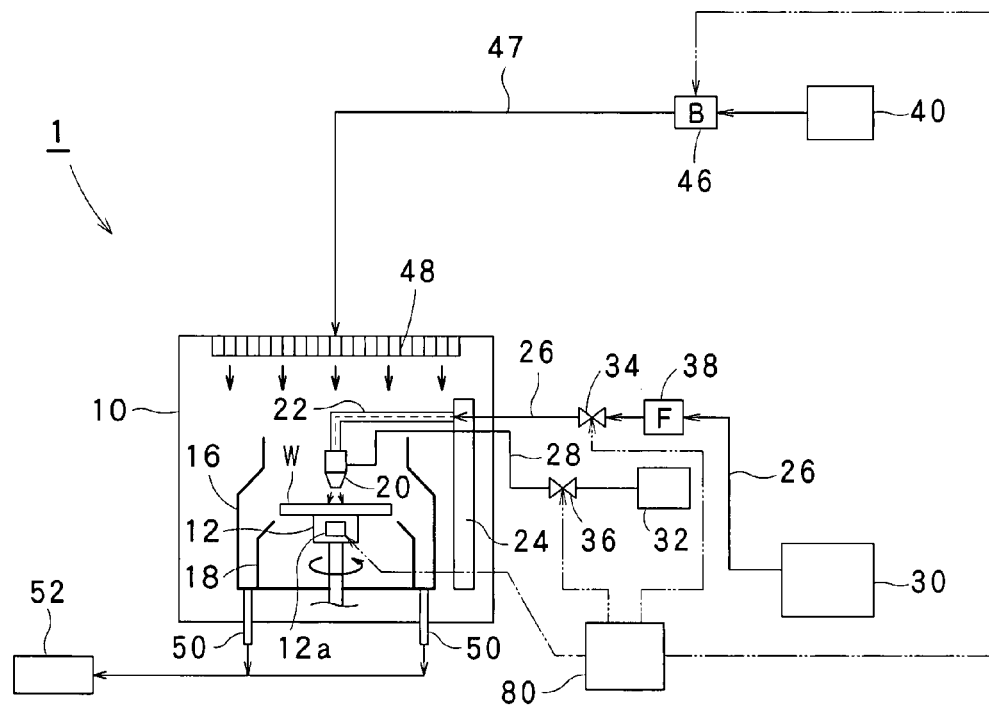
FIG. 8 is a schematic structural view showing still another structure of the substrate processing apparatus of the present invention.

Still another structure of the substrate processing apparatus 1 is described with reference to FIG. 8. FIG. 8 is a schematic structural view showing still another structure of the substrate processing apparatus 1 of the present invention.

To be specific, the substrate processing apparatus 1 shown in FIG. 8 differs from the substrate processing apparatus 1 shown in FIGS. 1 to 3 only in that a wafer heating mechanism 12a is disposed in the spin chuck 12. Other structures of the substrate processing apparatus 1 shown in FIG. 8 are substantially the same as those of the substrate processing apparatus 1 shown in FIGS. 1 to 3.

In the following description of an alternative example of the substrate processing apparatus 1 shown in FIG. 8, the same parts as those of the substrate processing apparatus 1 shown in FIGS. 1 to 3 are shown by the same reference numbers, and their detailed description is omitted.

The wafer heating mechanism 12a is formed of, e.g., a heater, and is incorporated in the spin base of the spin chuck 12. The wafer heating mechanism 12a is configured to heat a wafer W held by the spin chuck 12. The wafer heating mechanism 12a is controlled by the control unit 80, and is used at a step in which, when a temperature of a wafer W is lowered by spraying thereto a cleaning liquid containing HFE, the lowered temperature of the wafer W is returned to a temperature that is substantially the same as a temperature of an atmospheric air outside the chamber 10.

According to the substrate processing apparatus 1 shown in FIG. 8, after a cleaning liquid containing HFE is supplied onto a wafer W, a temperature of the wafer W can be returned to a temperature that is substantially the same as a temperature of an atmospheric air outside the chamber 10, by directly heating the wafer W held on the spin chuck 12 by the wafer heating mechanism 12a, in place of transferring the wafer W from the chamber 10 to the substrate-temperature adjusting chamber 84 by the second wafer transfer mechanism 88. Also in such a substrate processing apparatus 1, similar to the case in which there are used the second wafer transfer mechanism 88 and the substrate-temperature adjusting chamber 84, which are shown in FIG. 3, when a lowered temperature of the wafer W is returned to a temperature that is substantially the same as a temperature of an atmospheric air, it can be prevented that water droplets adhere to the wafer W resulting in dew formation, because of a dried condition of the wafer W.

As a nozzle to be disposed in the substrate processing apparatus 1, there may be used, in place of the binary fluid nozzle shown in FIG. 2, a single fluid nozzle that uses only a cleaning liquid containing HFE which has been sent from the cleaning liquid supply nozzle 26. When such a single fluid nozzle that uses only a cleaning liquid containing HFE is used, the single fluid nozzle may be provided with an ultrasonic-wave imparting mechanism for imparting ultrasonic waves to a cleaning liquid containing HFE to be sprayed from the nozzle.

Figure 9:
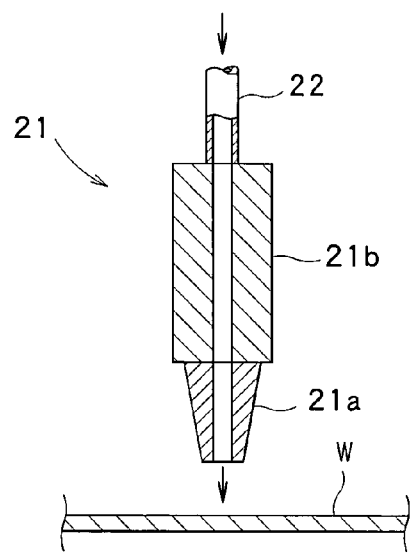
FIG. 9 is a sectional view showing a detailed structure of another nozzle disposed in the substrate processing apparatus of the present invention.

FIG. 9 is a sectional view showing a detailed structure of a single fluid nozzle provided with the above ultrasonic-wave imparting mechanism.

As shown in FIG. 9, in a single fluid nozzle 21 for spraying a cleaning liquid containing HFE to a wafer W, an ultrasonic head part 21b is attached to the nozzle body 21a. This ultrasonic head part 21b imparts ultrasonic vibrations to a cleaning liquid containing HFE sent to the nozzle body 21a from the cleaning-liquid flow path inside the arm 22. Due to the provision of the ultrasonic head part 21b, an ultrasonic vibration energy can be additionally given to a cleaning liquid of HFE to be sprayed to a wafer W from the nozzle body 21a of the single fluid nozzle 21, particles resting in minute recesses in a surface of the wafer W can be more effectively removed.

The invention claimed is:

1. A substrate processing apparatus comprising:
   a chamber;
   a substrate holding mechanism, disposed in the chamber, that horizontally holds a substrate to be processed;
   a cleaning-liquid supply unit that supplies a cleaning liquid containing hydrofluoro ether onto a substrate to be processed horizontally held by the substrate holding mechanism to form a liquid film of the cleaning liquid containing hydrofluoro ether on the substrate to be processed;
   a gas supply unit that supplies a gas into the chamber, the gas being configured to prevent moisture from being adhered to a substrate to be processed when a cleaning liquid containing hydrofluoro ether is supplied onto the substrate to be processed; and
   a control unit that controls the cleaning-liquid supply unit and the gas supply unit such that the gas is supplied from the gas supply unit into the chamber, before the cleaning liquid containing hydrofluoro ether is supplied from the cleaning-liquid supply unit onto the substrate to be processed, horizontally held by the substrate holding mechanism, and the liquid film of the cleaning liquid containing hydrofluoro ether is formed on the substrate to be processed.

2. The substrate processing apparatus according to claim 1, wherein the gas is a nitrogen gas or an air having a humidity lower than a humidity of an atmospheric air outside the chamber.

3. The substrate processing apparatus according to claim 1, wherein the gas is a nitrogen gas or an air having a temperature lower than a temperature of an atmospheric air outside the chamber.

4. The substrate processing apparatus according to claim 1, wherein the gas is formed of a vapor of hydrofluoro ether.

5. The substrate processing apparatus according to claim 1 further comprising a cleaning-liquid cooling mechanism that cools the cleaning liquid containing hydrofluoro ether to be supplied from the cleaning-liquid supply unit onto a substrate to be processed.

6. The substrate processing apparatus according to claim 1 further comprising a temperature-adjusting unit that returns a temperature of the substrate to be processed to a temperature that is substantially the same as a temperature of an atmospheric air outside the chamber under a humidity lower than that of the atmospheric air, when the cleaning liquid containing hydrofluoro ether is supplied from the cleaning-liquid supply unit onto the substrate to be processed to lower the temperature of the substrate to be processed.

7. The substrate processing apparatus according to claim 6, wherein the temperature-adjusting unit is formed of a gas heating mechanism that heats a gas supplied from the gas supply unit into the chamber, and a temperature of the substrate to be processed is returned to a temperature that is substantially the same as a temperature of an atmospheric air outside the chamber, by sending a gas heated by the gas heating mechanism from the gas supply unit into the chamber, after the cleaning liquid containing hydrofluoro ether is supplied onto the substrate to be processed from the cleaning-liquid supply unit.

8. The substrate processing apparatus according to claim 6, wherein the temperature-adjusting unit is formed of a substrate heating mechanism disposed on the substrate holding mechanism, and a temperature of the substrate to be processed is returned to a temperature that is substantially the same as a temperature of an atmospheric air outside the chamber, by heating the substrate to be processed by the substrate heating mechanism, after the cleaning liquid containing hydrofluoro ether is supplied onto the substrate to be processed from the cleaning-liquid supply unit.

9. The substrate processing apparatus according to claim 1 further comprising a substrate-temperature adjusting chamber disposed outside the chamber, the substrate-temperature adjusting chamber being filled with a gas having a humidity lower than a humidity of an atmospheric air outside the chamber and a temperature that is substantially the same as a temperature of the atmospheric air.

10. The substrate processing apparatus according to claim 1 further comprising an ultrasonic-wave imparting mechanism that imparts ultrasonic vibrations to the cleaning liquid containing hydrofluoro ether to be supplied from the cleaning-liquid supply unit onto a surface of the substrate to be processed.

11. The substrate processing apparatus according to claim 1 further comprising: a further gas supply unit for generating liquid droplets that supplies a gas for generating liquid droplets; and a binary fluid nozzle in which the cleaning liquid containing hydrofluoro ether, which is supplied from the cleaning-liquid supply unit, and a gas for generating liquid droplets, which is supplied from the further gas supply unit for generating liquid droplets, are mixed with each other to generate liquid droplets containing hydrofluoro ether, the binary fluid nozzle spraying the liquid droplets onto a substrate to be processed held by the substrate holding mechanism.

12. A substrate processing method comprising the steps of:
   holding, horizontally, a substrate to be processed in a chamber;
   supplying a gas into the chamber, the gas being configured to prevent moisture from being adhered to a substrate to be processed, before a cleaning liquid containing hydrofluoro ether is supplied onto the substrate to be processed; and
   supplying the cleaning liquid containing hydrofluoro ether onto the substrate to be processed, placed in the chamber in which the gas is already supplied, and cleaning the substrate on which a liquid film of the cleaning liquid containing hydrofluoro ether is formed.

13. The substrate processing method according to claim 12, wherein the gas is a nitrogen gas or an air having a humidity lower than a humidity of an atmospheric air outside the chamber.

14. The substrate processing method according to claim 12, wherein the gas is a nitrogen gas or an air having a temperature lower than a temperature of an atmospheric air outside the chamber.

15. The substrate processing method according to claim 12, wherein the gas is formed of a vapor of hydrofluoro ether.

16. The substrate processing method according to claim 12, wherein a temperature of the cleaning liquid containing hydrofluoro ether to be supplied onto a substrate to be processed is lower than a temperature of an atmospheric air outside the chamber.

17. The substrate processing method according to claim 12 further comprising a step of returning a temperature of the substrate to be processed, the temperature having been lowered by supplying the cleaning liquid containing hydrofluoro ether onto the substrate to be processed, to a temperature that is substantially the same as a temperature of an atmospheric air outside the chamber under a humidity lower than a humidity of the atmospheric air.

* * * * *